United States Patent
Herrmann (10) Patent No.: US 11,574,952 B2
(45) Date of Patent: Feb. 7, 2023

(54) OPTOELECTRONIC SEMICONDUCTOR COMPONENT AND METHOD FOR PRODUCING OPTOELECTRONIC SEMICONDUCTOR COMPONENTS

(71) Applicant: OSRAM OLED GmbH, Regensburg (DE)

(72) Inventor: Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/772,741

(22) PCT Filed: Dec. 17, 2018

(86) PCT No.: PCT/EP2018/085287
§ 371 (c)(1),
(2) Date: Jun. 12, 2020

(87) PCT Pub. No.: WO2019/121556
PCT Pub. Date: Jun. 27, 2019

(65) Prior Publication Data
US 2021/0005660 A1   Jan. 7, 2021

(30) Foreign Application Priority Data
Dec. 20, 2017   (DE) .......................... 102017130760.5

(51) Int. Cl.
*H01L 33/08*  (2010.01)
*H01L 33/24*  (2010.01)
(Continued)

(52) U.S. Cl.
CPC ........ *H01L 27/156* (2013.01); *H01L 33/0093* (2020.05); *H01L 33/08* (2013.01);
(Continued)

(58) Field of Classification Search
CPC . H01L 27/15–156; H01L 33/08; H01L 33/24; H01L 33/387; H01L 33/62; H01L 33/42
See application file for complete search history.

(56) References Cited

U.S. PATENT DOCUMENTS 10,418,499 B2 *   9/2019   Schneider ....... H01L 31/035227
2011/0240959 A1 *  10/2011   Konsek ................. H01L 29/413
                                                           257/13
(Continued)

FOREIGN PATENT DOCUMENTS

KR      20160010404 A       1/2016
WO      WO-2013080174 A1 *  6/2013   ............. H01L 33/18

*Primary Examiner* — Yu Chen
(74) *Attorney, Agent, or Firm* — Slater Matsil, LLP (57) ABSTRACT

An optoelectronic semiconductor component and a method for producing optoelectronic semiconductor components are disclosed. In an embodiment a optoelectronic semiconductor component includes a plurality of semiconductor pillars, each pillar having a tip and a base region at opposite ends, an electrical isolation layer surrounding at least part of the semiconductor pillars on side faces and at least one first electrical contact pad and at least one second electrical contact pad for energizing the semiconductor pillars, wherein a first portion of the semiconductor pillars are emitter pillars configured to generate radiation, wherein a second portion of the semiconductor pillars are non-radiating electrical contact pillars, wherein the contact pillars extend through the isolation layer such that all contact pads are located on the same side of the isolation layer, and wherein each contact pillars is coated with an electrically ohmically conductive outer layer.

11 Claims, 8 Drawing Sheets

(51) Int. Cl.
*H01L 27/15* (2006.01)
*H01L 33/00* (2010.01)
*H01L 33/38* (2010.01)
*H01L 33/62* (2010.01)

(52) U.S. Cl.
CPC ............ *H01L 33/24* (2013.01); *H01L 33/387* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2011/0254034 A1* | 10/2011 | Konsek | H01L 33/08 257/98 |
| 2011/0309382 A1* | 12/2011 | Lowgren | H01L 33/60 257/88 |
| 2012/0223289 A1* | 9/2012 | Gwo, Jr. | H01L 33/18 257/13 |
| 2014/0077156 A1 | 3/2014 | Bavencove et al. | |
| 2014/0363912 A1 | 12/2014 | Ohlsson et al. | |
| 2015/0303350 A1 | 10/2015 | Seo et al. | |
| 2015/0333216 A1* | 11/2015 | Pourquier | H01L 33/0095 257/88 |
| 2016/0056330 A1* | 2/2016 | Scaringella | H01L 33/42 257/13 |
| 2017/0221963 A1* | 8/2017 | Gardner | H01L 33/44 |
| 2018/0277523 A1* | 9/2018 | Ahmed | H01L 25/0753 |

\* cited by examiner

OPTOELECTRONIC SEMICONDUCTOR COMPONENT AND METHOD FOR PRODUCING OPTOELECTRONIC SEMICONDUCTOR COMPONENTS

This patent application is a national phase filing under section 371 of PCT/EP2018/085287, filed Dec. 17, 2018, which claims the priority of German patent application 102017130760.5, filed Dec. 20, 2017, each of which is incorporated herein by reference in its entirety.

TECHNICAL FIELD

An optoelectronic semiconductor component is disclosed. In addition, a method for producing optoelectronic semiconductor components is specified.

SUMMARY

Embodiments provide an optoelectronic semiconductor component which can be uniformly energized.

In accordance with at least one embodiment the semiconductor component comprises a plurality of semiconductor pillars. The semiconductor pillars are preferably based on at least one semiconductor material. The semiconductor material is preferably a III-V compound semiconductor material, for example, a nitride compound semiconductor material such as $Al_nIn_{1-n-m}Ga_mN$ or a phosphide compound semiconductor material such as $Al_nIn_{1-n-m}Ga_mP$, or else an arsenide compound semiconductor material, such as $Al_nIn_{1-n-m}Ga_mAs$ or $Al_nGa_mIn_{1-n-m}As_kP_{1-k}$, where in each case $0 \leq n \leq 1$, $0 \leq m \leq 1$ and $n+m \leq 1$, and $0 \leq k < 1$. The following preferably applies to at least one layer or to all layers of the semiconductor layer sequence: $0 < n \leq 0.8$, $0.4 \leq m < 1$ and $n+m \leq 0.95$, as well as $0 < k \leq 0.5$. In this case, the semiconductor layer sequence can comprise dopants and additional components. For the sake of simplicity, however, only the essential complements of the crystal lattice of the semiconductor material, thus Al, As, Ga, In, N or P are specified, even if these may be partially supplemented and/or replaced by trace amounts of other substances.

According to at least one embodiment, the semiconductor pillars each have a tip and a base region at the opposite end.

The term tip does not necessarily mean that the semiconductor pillars form a point at the relevant end, although this may be the case. In other words, the terms tip and base region are understood to refer to opposite ends of the semiconductor pillars, wherein the different terms are used to distinguish between the ends. In particular, irrespective of the exact geometric shape, the term tip refers to a region located at a contact tip and/or preferably to a region of the semiconductor pillars located furthest from a growth substrate. The base region is then, in particular, a region of the semiconductor pillars that is closest to the growth substrate. Thus, side faces of horizontal semiconductor pillars facing away from the growth substrate can also be referred to as tips. However, the tip preferably bounds the semiconductor pillars along a direction of growth away from the growth substrate. The growth direction is preferably oriented vertically or perpendicular to the growth substrate with a tolerance of no more than 30° or 15°.

In accordance with at least one embodiment, the semiconductor component comprises at least one electrical isolation layer. The isolation layer is electrically insulating. No current flows through the isolation layer when the semiconductor component is used as intended.

According to at least one embodiment, the isolation layer partially or completely surrounds the semiconductor pillars on side faces. The isolation layer can touch the side faces. In other words, the semiconductor pillars can be embedded in the isolation layer, viewed from above.

According to at least one embodiment, the semiconductor component comprises one or more first electrical contact pads and one or more second electrical contact pads. The at least one first electrical contact pad and the at least one second electrical contact pad are used to energize the semiconductor pillars. It is possible that these contact pads are electrical connection points for external electrical contacting of the semiconductor component. The first and second contact pads can be arranged in a common plane, specifically parallel to the isolation layer and/or oriented parallel to each other.

According to at least one embodiment, a first portion of the semiconductor pillars is designed as emitter pillars. These semiconductor pillars are designed to generate radiation. In particular, during operation of the semiconductor component near-ultraviolet radiation or visible light or near-infrared radiation is generated in the emitter pillars, preferably visible light such as blue light, green light and/or red light.

According to at least one embodiment, a second portion of the semiconductor pillars is designed as non-radiating electrical contact pillars. This means that during operation, no radiation is generated in the contact pillars and the contact pillars are designed solely as electrical transport devices.

Embodiments provide only emitter pillars and contact pillars, and therefore no other type of semiconductor pillars.

According to at least one embodiment, the contact pillars extend through the isolation layer. This allows all electrical contact pads to be located on the same side of the isolation layer. This allows the semiconductor component to be surface-mountable.

According to at least one embodiment, all semiconductor pillars, i.e., both the emitter and the contact pillars, have the same structure in respect of the design of their semiconductor materials, in particular they are identically grown. In other words, the emitter pillars are preferably indistinguishable from the contact pillars in respect of the semiconductor materials and semiconductor structure.

According to at least one embodiment, the contact pillars are each coated with an electrically ohmically conductive outer layer. The outer layer preferably follows the shape of the semiconductor pillars. The outer layer can partially or completely envelop the associated semiconductor pillars for the contact pillars, and in particular completely or partially cover the side faces and preferably completely cover the tips. It is possible that the only difference between the contact pillars and the emitter pillars is found in the outer layer.

Ohmically conductive means, in particular, that the outer layer is a metallic layer. Alternatively, the outer layer can be a layer of a transparent conductive oxide that is ohmically conductive. It is also possible that the outer layer is composed of a plurality of sub-layers, for example of different metal layers.

In at least one embodiment, the optoelectronic semiconductor component comprises a plurality of semiconductor pillars, each having a tip and a base region at the opposite end. On side faces, the semiconductor pillars are at least partially surrounded by an electrical isolation layer. The semiconductor pillars are energized via at least one first electrical contact pad and at least one second electrical contact pad. A first portion of the semiconductor pillars is designed as emitter pillars for radiation generation, and a second portion of the semiconductor pillars as non-radiating electrical contact pillars. The contact pillars extend through the isolation layer such that all contact pads are located on the same side of the isolation layer. The contact pillars are each provided with an electrically ohmically conductive outer layer.

In the semiconductor component described here, due to the contact pillars a uniform energization of an active region is possible. The semiconductor component is preferably designed as a light-emitting diode, LED for short, or as a light-emitting diode chip, or LED chip. In addition, a spatially resolved energizing of extremely small segments of the semiconductor component is possible, one segment in particular having one or more of the emitter pillars. This enables the activation and electrical contacting of submicron structures. This can be realized in particular by the current-carrying contact pillars, which have dimensions in the micron range or sub-micron range.

An alternative means of energizing a semiconductor layer sequence is to etch holes through an active layer, thereby causing a current distribution, in particular in an n-conducting layer. Such etched holes, however, have comparatively large geometric dimensions, which means that accurate, locally high-resolution energizing is not possible.

In the semiconductor component described here, the semiconductor pillars, also known as microrods or nanorods, simultaneously form the vias for electrical connection and contacting of chip regions, chip surfaces or chip planes. In this case various wiring configurations and radiation directions are possible. The subdivision into the emitter pillars and the contact pillars can be implemented efficiently during the manufacturing process. The semiconductor pillars can have different geometries and, for example, a pyramidal or prismatic shape, in particular being formed as rectangular prisms or hexagonal prisms. The semiconductor pillars can be epitaxially grown bar arrangements.

Suitable semiconductor components can be used, for example, in the field of industrial imaging, for example for data displays, in the medical field and for displaying simulations, for example in the field of mechanical engineering. In addition, such semiconductor components can be used for head-up displays, or HUD for short, and/or head-mounted displays, HMD for short, in the automotive, aerospace and defense sectors. Such semiconductor components can also be used for industrial projections of interference patterns or ring patterns, for example. They can also be used in metrology, in 3D sensors, rapid prototyping, lithography and/or the field of infrared projection.

In the case of the semiconductor component described here, very small diameters can be implemented for the vias, i.e., for the contact pillars. Their diameter is in particular at least 10 nm or 30 nm and/or not more than 10 µm or 3 µm or 1 µm. The preferably metallic outer layer allows a low electrical resistance to be achieved. Since the outer layer can be made of a reflective metal such as silver, a low light absorption can be achieved. In addition, a high density of individual electrical connections per unit area is possible. For example, a semiconductor pillar with a radius of 100 nm only requires a footprint of approximately 0.03 µm$^2$. This means that up to thirty contact pillars per µm$^2$ could theoretically be accommodated as electrical vias.

According to at least one embodiment, the outer layers form metallic layers that are impermeable to the radiation generated during operation, in particular reflective layers. Alternatively, the outer layers can be designed as Bragg mirrors with electrically conductive layers.

According to at least one embodiment, the outer layers extend beyond each of the tips of the emitter pillars in a direction away from the base regions. This means that due to the outer layers, the contact pillars can each project beyond the emitter pillars in the direction away from the base regions. In this case, due to the outer layers the contact pillars are taller than the emitter pillars.

According to at least one embodiment, at least one current distribution layer is applied to a side of the isolation layer opposite the contact pads. The current distribution layer provides an electrical connection between at least one contact pillar and at least one associated emitter pillar in each case. In other words, the current distribution layer is a laterally current-carrying layer, via which a plurality of the emitter pillars can also be electrically connected to one or more contact pillars. For example, current flows from the associated first electrical contact pad directly into the associated emitter pillar, from this into the current distribution layer, then into the outer layer and along the associated contact pillar to the second electrical contact pad.

According to at least one embodiment, the current distribution layer is permeable to the radiation generated in the at least one associated emitter pillar. The current distribution layer is preferably transparent to visible light and/or ultraviolet radiation. Alternatively, the current distribution layer is designed to be opaque and then preferably specularly reflecting.

According to at least one embodiment, the current distribution layer has a thickness or a mean thickness of at least 10 nm or 30 nm or 70 nm. Alternatively, or in addition, the thickness or mean thickness of the current distribution layer is no more than 1 µm or 0.4 µm or 0.2 µm. In particular, the thickness of the current distribution layer is less than the mean height of the semiconductor pillars. The current distribution layer thickness is preferably no more than 50% or 20% of the mean height of the semiconductor pillars, in particular neglecting the outer layer.

According to at least one embodiment, the current distribution layer completely covers the associated outer layer and/or the tips of the associated emitter pillars. In this case, the current distribution layer can extend consistently beyond the associated semiconductor pillars in the direction away from the base regions. A side of the current distribution layer facing away from the base regions can be planar in shape.

According to at least one embodiment, the radiation generated in the associated emitter pillars exits the semiconductor device through the current distribution layer. The current distribution layer can be a light exit surface of the semiconductor device.

In accordance with at least one embodiment, the emitter pillars are grouped together into groups. Each group has a plurality of the emitter pillars.

According to at least one embodiment, there is exactly one current distribution layer present per group. Starting from exactly one or from more than one contact pillar of the corresponding group, the emitter pillars of this group are electrically contacted.

According to at least one embodiment, the groups can be electrically activated independently of each other. This allows the groups to form pixels or a primary color of a pixel. For example, there are red-emitting groups, green-emitting groups, and blue-emitting groups present, which can form RGB pixels.

According to at least one embodiment, the semiconductor pillars each have a semiconductor core, an active zone applied thereto and a semiconductor shell applied thereto. For example, the semiconductor cores are n-doped, the active zone can have a single quantum well structure or a multiple quantum well structure or be formed by a pn-junction, and the semiconductor shell is p-doped, for example.

According to at least one embodiment, the semiconductor pillars have an energization layer. The energization layer is preferably applied to the semiconductor shell directly and in a positive-locking manner. The energization layer can be made of a highly-doped semiconductor material, of a transparent conductive oxide such as ITO, or else a metal layer.

According to at least one embodiment, the semiconductor cores of the emitter pillars are each directly electrically contacted by means of the first contact pads. The first contact pads can touch the associated semiconductor cores.

According to at least one embodiment, the emitter pillars are each only indirectly electrically connected to the second contact pad via the contact pillars. The second contact pad can be attached directly to the outer layer and optionally to the semiconductor core of the associated contact pillar. An electrical cross-connection between the emitter pillars and the contact pillars is preferably only made via the at least one current distribution layer, as described above.

According to at least one embodiment, the emitter pillars assigned to a contact pillar are arranged rotationally symmetrically or point-symmetrically around this contact pillar, viewed from above. For example, three, four, or six of the emitter pillars are arranged symmetrically around the associated contact pillar. It is also possible that the contact pillar and the associated emitter pillars form an n·m arrangement, where n, m are preferably each a natural odd number greater than or equal to 3. The numbers n and m can be the same natural number or different numbers. The contact pillar is preferably arranged centrally in this array of semiconductor pillars.

According to at least one embodiment, the second contact pad is attached to the contact pillar, in particular directly attached. It is possible that the second contact pads can be electrically contacted independently of each other and separately. Alternatively, a plurality of contact pads can be electrically interconnected and form a common ground contact, for example. This can also be the case for the first contact pads.

According to at least one embodiment, the second contact pad, viewed from above, is completely surrounded by the electrically corresponding first contact pad. This means that the first contact pad, viewed from above, can surround the second contact pad in a circular shape or in the shape of a polygon, such as a regular rectangle or a regular hexagon.

According to at least one embodiment, the radiation generated during operation is emitted in a direction away from the base regions via the tips of the associated semiconductor pillars. The contact pads are preferably located on the same side of the isolation layer as the base regions. The contact pads are preferably designed as mirrors for the generated radiation.

According to at least one embodiment, the base regions extend beyond the isolation layer or terminate flush with the isolation layer. Thus, it is possible that the base regions protrude into the contact pads in a direction away from the isolation layer.

According to at least one embodiment, the radiation produced in operation is emitted in a direction away from the tips via the base regions, so that the contact pads are located on the same side of the isolation layer as the tips. The tips preferably protrude into the contact pads. Alternatively, the tips may extend beyond the contact pads.

According to at least one embodiment, the outer layers are each part of the associated second contact pad. It is also possible that the second contact pads are formed entirely by the outer layer. In this case, an additional metallization for the second contact pads can be omitted. If other components for the second contact pads are omitted, the outer layers are preferably comparatively thick, for example with a thickness of at least 0.8 µm, especially on a side of the corresponding contact pillars facing away from the base regions.

According to at least one embodiment, the isolation layer mechanically binds the semiconductor pillars together. This means that the isolation layer can be a carrier of the semiconductor component. It is possible that due to the isolation layer the semiconductor component can be handled as a mechanically integral component. In addition, the first and second electrical contact pads can increase the loading capacity of the semiconductor component, so that due to the isolation layer together with the contact pads the semiconductor component is self-supporting.

According to at least one embodiment, the isolation layer completely covers the side faces of the semiconductor pillars. In particular, this means that a thickness of the isolation layer is equal to a height of the semiconductor pillars, or equal to a height of the semiconductor pillars including the outer layer of the contact pillars.

According to at least one embodiment, viewed from above the isolation layer, a mean distance between adjacent contact pillars is at least 2 µm or 5 µm or 20 µm. Alternatively or in addition, the mean distance is no more than 200 µm or 100 µm or 50 µm. The contact pillars can therefore be placed relatively close to each other.

According to at least one embodiment, the contact pillars are each assigned at least one or five or 10 of the emitter pillars uniquely or bi-uniquely. This number is alternatively or additionally a maximum of 500 or 100 or 60 or 20.

In accordance with at least one embodiment, the semiconductor pillars are hexagonal pillars. Their tips can be formed by flattened regions, i.e., planar, or else by hexagonal pyramids. This is particularly the case if the semiconductor pillars are based on the InGaN material system.

In accordance with at least one embodiment, the semiconductor pillars have a mean diameter of at least 10 nm or 0.1 µm or 0.2 µm or 0.5 µm. Alternatively or in addition, the mean diameter is no more than 10 µm or 5 µm or 2 µm.

According to at least one embodiment, the semiconductor pillars each have a mean height of at least 0.4 µm or 0.8 µm or 2 µm. Alternatively or in addition, the mean height is no more than 30 µm or 20 µm or 10 µm.

According to at least one embodiment, the outer layers have a mean thickness of at least 0.1 µm or 0.2 µm or 0.8 µm, at least at the tips of the contact pillars. This thickness can alternatively or additionally be no more than 8 µm or 4 µm or 1.5 µm.

In addition, a method for producing optoelectronic semiconductor components is specified. The semiconductor components are designed as described in connection with one or more of the above-mentioned embodiments. Features of the method therefore also apply to the semiconductor components, and vice versa.

In at least one embodiment, the method comprises the following steps, in particular in the order indicated:
A) providing a growth substrate and applying a mask layer, and growing the semiconductor pillars starting from openings in the mask layer, B) creating expansion openings around the openings for the contact pillars, C) generating the outer layers such that the contact pillars are formed and the outer layers optionally penetrate the associated expansion openings, D) attaching the isolation layer and subsequently detaching the semiconductor pillars from the growth substrate, and E) creating the contact pads.

In contrast to the sequence given above, step B) may also only be performed after step C) or, preferably, after step D).

According to at least one embodiment, step D) has the following sub-steps, in particular in the order indicated:

D1) providing an intermediate carrier having a raw material layer for the isolation layer, D2) pressing the semiconductor pillars into the raw material layer so that at least the emitter pillars and optionally the outer layers remain spaced apart from the intermediate carrier, D3) curing the raw material layer, for example by temperature reduction or photochemically, and D4) detaching the intermediate carrier and exposing the outer layers. Step D4) is optional in case the outer layers are brought into contact with the intermediate carrier in step D2).

BRIEF DESCRIPTION OF THE DRAWINGS

In the following an optoelectronic semiconductor component described herein and a method described herein are explained in more detail with reference to the drawing and on the basis of exemplary embodiments. Identical reference signs indicate identical elements in the individual figures. The represented elements are not shown true to scale, however; rather, individual elements can be represented in exaggerated size for improved comprehension.

In the drawings.

DETAILED DESCRIPTION OF ILLUSTRATIVE EMBODIMENTS

FIG. 1 illustrates a production process for an optoelectronic semiconductor component. FIG. 1A shows that a plurality of semiconductor pillars 3 are epitaxially grown on a growth substrate 70. Optionally, a growth layer 74 is located on the growth substrate 70. A mask layer 71, which has base openings 72, is also present on the growth layer 74. The semiconductor pillars 3 grow out of the base openings 72. For example, the mask layer 71 is a silicon nitride layer, in which the base openings 72 are generated, preferably by photolithography.

Figure 1A:
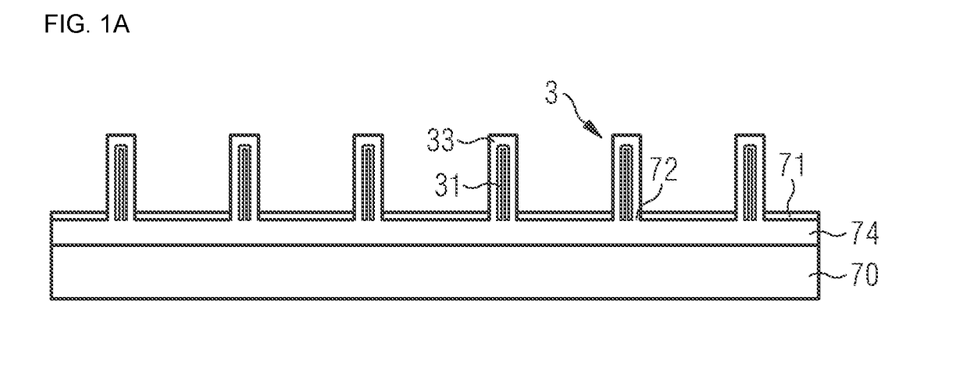
FIGS. 1A to 1J show schematic sectional drawings of method steps of a method described here for producing exemplary embodiments of optoelectronic semiconductor components.

The semiconductor pillars 3 each preferably have a semiconductor core 31 and a semiconductor shell 33. An active zone, not drawn in FIG. 1A, is located between them. All semiconductor pillars 3 are grown identically within the manufacturing tolerances.

Figure 1B:
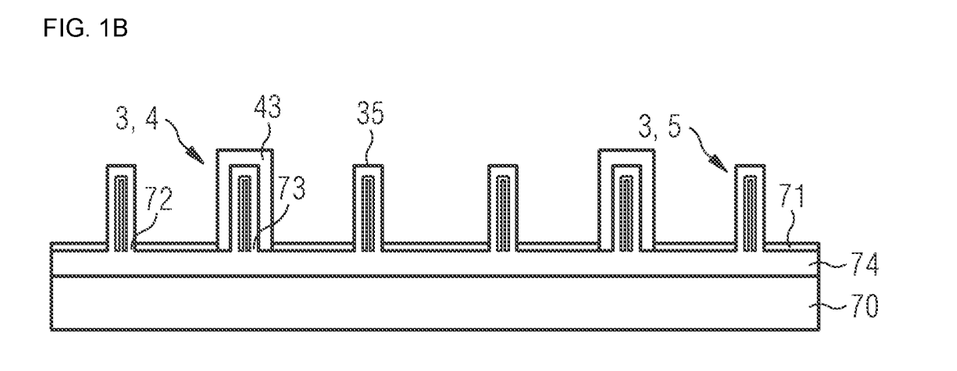

FIG. 1B illustrates that a metallic outer layer 43 is produced over some of the semiconductor pillars 3. The outer layer 43 is ohmically conductive. The outer layer 43, having a thickness of 0.5 µm for example, can completely envelop the associated semiconductor pillars 3 which are provided for contact pillars 4. Semiconductor pillars 3 provided as emitter pillars 5 remain free of such outer layers 43. Mask layers used during manufacture are not drawn, in order to simplify the illustration.

In addition, FIG. 1B shows as an option that the base openings 72 in the mask layer for the contact pillars 4 are enlarged to form expansion openings 73. If such an enlargement is made to the expansion openings 73, the outer layer 43 can be in contact with the growth substrate 70 or the growth layer 74 and, in particular, can penetrate the mask layer 71 completely. In this variant, it is possible to use the same photomask, not drawn, for creating the extension openings 73 and the outer layers 43.

Figure 1C:
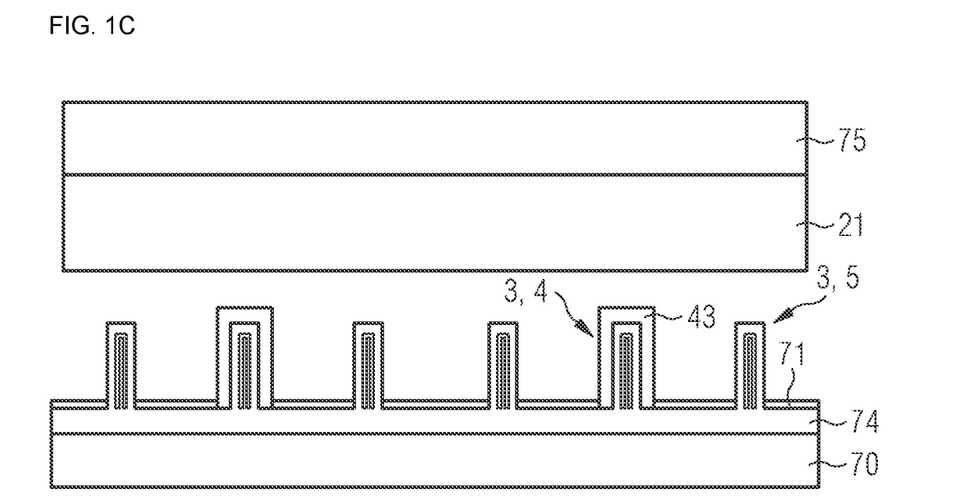

In the step of FIG. 1C an intermediate carrier 75 is provided. The intermediate carrier 75 contains a raw material layer 21, made of a silicone or a thermoplastic, for example. The raw material layer 21 is comparatively soft.

Figure 1D:
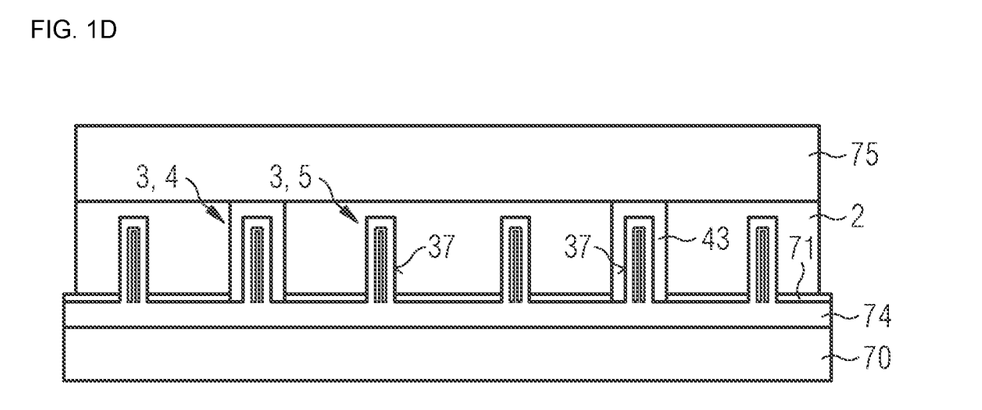

The semiconductor pillars 3 with the outer layers 43 are pressed into the raw material layer 21, whereupon the raw material layer 21 is cured to form an isolation layer 2. This is shown in FIG. 1D. The outer layers 43 can touch the intermediate carrier 75 or else, other than shown in FIG. 1D, they can remain spaced apart from the intermediate carrier 75 by a part of the isolation layer 2.

Figure 1E:
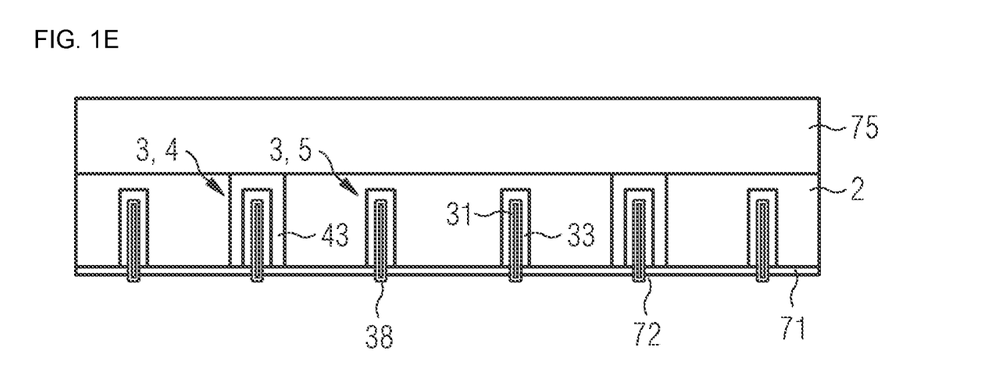

FIG. 1E illustrates that the growth substrate 70 has been detached. The growth layer 74 is also preferably removed. From the growth layer 74, broken-off regions 38 can remain on the semiconductor pillars 3.

If no expansion openings 73 are created in the step of FIG. 1B, then in the step of FIG. 1E a side facing away from the intermediate carrier 75 is essentially formed entirely by the mask layer 71 and by the broken-off regions 38 optionally protruding from the mask layer 71. The broken-off regions 38 and thus the base openings 72 correspond essentially to a diameter of the semiconductor cores 31.

Figure 1F:
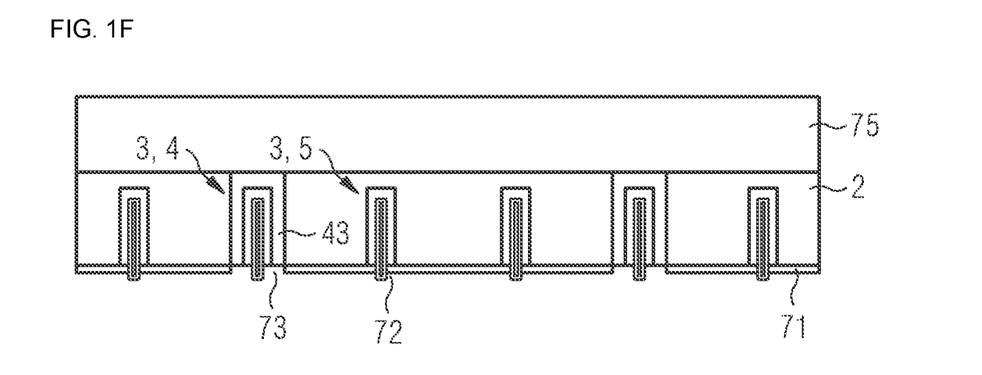

FIG. 1F, on the other hand, illustrates that the expansion openings 73 can be produced after the growth substrate 70 has been removed. This production of the expansion openings 73 of FIG. 1F is an alternative to the process step as illustrated in FIG. 1B.

The expansion openings 73 can terminate flush with the outer layers 43 in the lateral direction, so that in the case of the contact pillars 4, both the entire semiconductor pillars 3 as well as the associated outer layers 43 are partially or preferably completely free of the mask layer 71. In the step of FIG. 1F there is no change to the mask layer 71 on the emitter pillars 5.

Figure 1G:
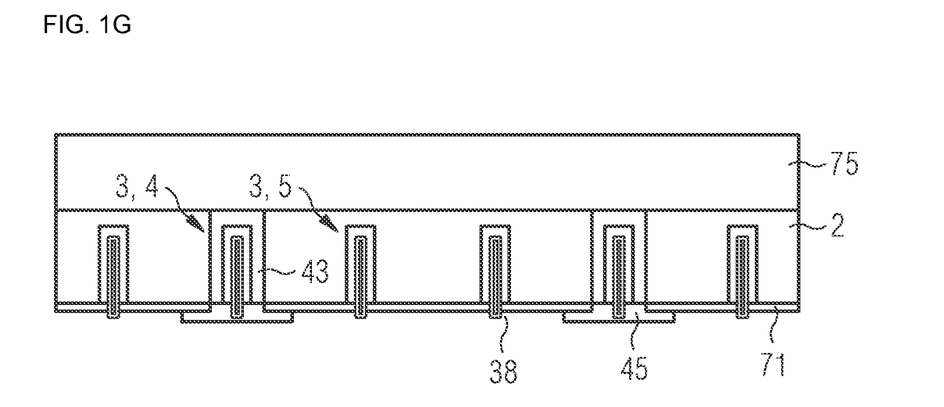

Optionally, the broken-off regions 38 at least on the contact pillars 4 can be removed, see FIG. 1G.

FIG. 1G also illustrates that metallisations 45 are produced on each of the contact pillars 4. The metallisation 45 can be formed from a single layer or else, unlike in the drawing, from a plurality of layers. As an alternative to metallisations, electrically conductive, transparent oxide layers can also be used.

Figure 1H:
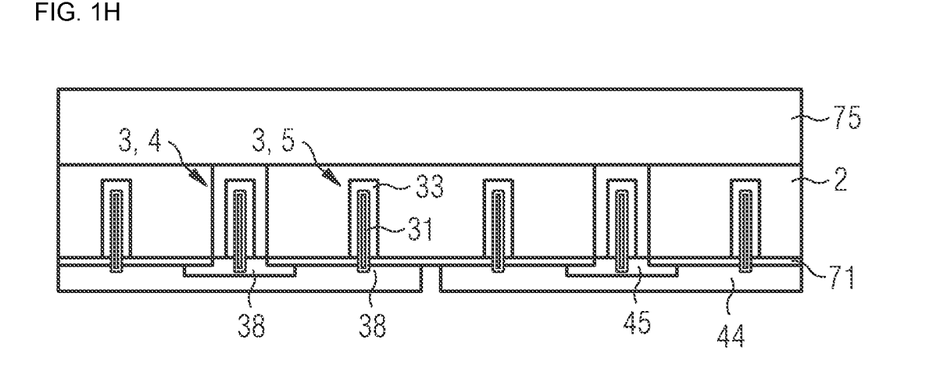

FIG. 1H shows that the broken-off regions 38 are still present both on the contact pillars 4 and the emitter pillars 5. A number of the emitter pillars 5 are electrically connected to the associated contact pillar 4 via a current distribution layer 44. The current distribution layer 44 is preferably radiation-permeable, for example made from ITO. The current distribution layer 44 is electrically connected to the metallization 45 and thus to the outer layer 43 and to the semiconductor cores 31 of the associated emitter pillars 5, but not to the active zone or the semiconductor shells 33 thereof.

Figure 1I:
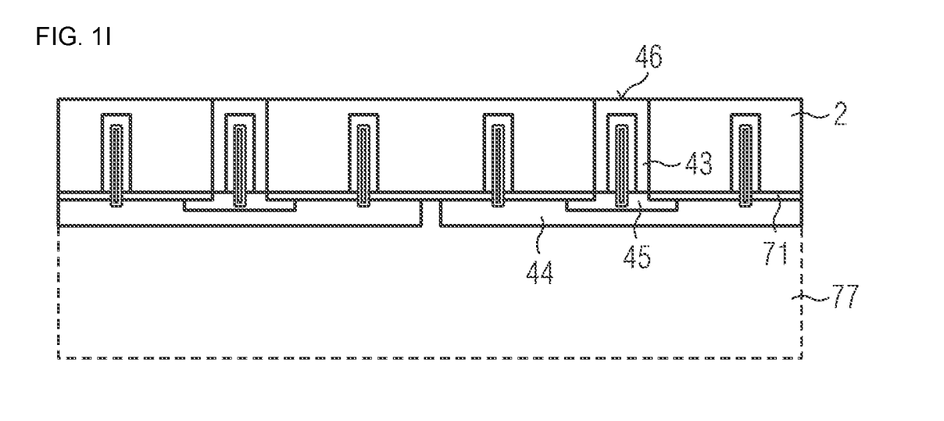

According to FIG. 1I, a carrier 77 is attached and the intermediate carrier 75 has been removed. The carrier 77 can be a temporary carrier or a permanent carrier. The carrier 77 is preferably radiation-permeable.

Figure 1J:
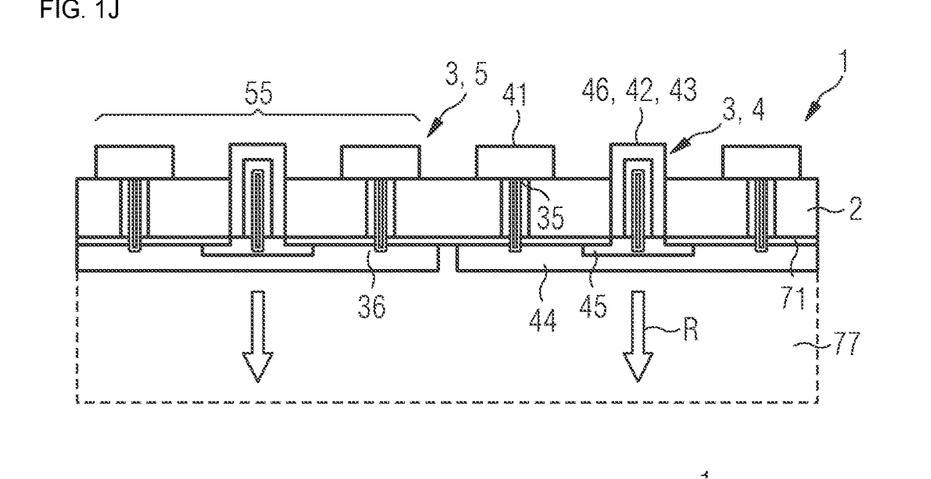

According to FIG. 1J, on a side of the isolation layer 2 facing away from the carrier 77, first electrical contact pads 41 are produced on the emitter pillars 5 and second electrical contact pads 42 are produced on the contact pillars 4. The contact pads 41, 42 are produced galvanically, for example. The contact pads 41, 42 can also be formed from one or more metal layers, alternatively from transparent conductive oxides.

FIG. 1J also illustrates that a radiation R generated during operation is emitted through the carrier 77 and through the current distribution layers 44. The contact pillars 4 also provide an electrical subdivision into groups 55 of emitter pillars 5 with the associated contact pillar 4. In contrast to the example shown, for redundancy reasons a plurality of the contact pillars 4 can also be present per group 55.

Finally, it can be seen from FIG. 1J that the isolation layer 2 is optionally reduced in thickness so that, for example, the semiconductor pillars 3 for the contact pillars 4 can project out of the isolation layer 2. The same can also apply to the emitter pillars 5, in contrast to the illustration of FIG. 1J. In contrast to the drawing in FIG. 1J, it is also possible that emitter pillars 5 are merely exposed and not reduced in height.

Figure 1K:
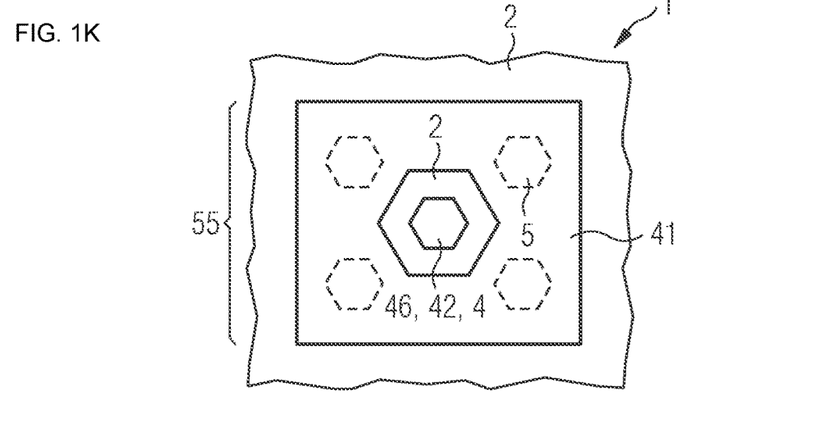
FIG. 1K shows a schematic bottom view of an exemplary embodiment of an optoelectronic semiconductor component described here.

FIG. 1K shows a closer view of the contact pads 41, 42 of the semiconductor component 1 of FIG. 1J. For example, four of the emitter pillars 5 are arranged point-symmetrically around the centrally positioned contact pillar 4.

Figure 2:
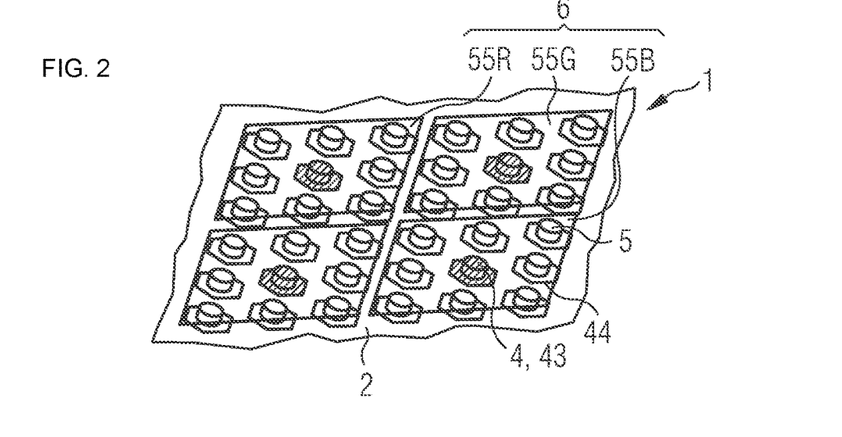
FIG. 2 shows a perspective plan view of an exemplary embodiment of an optoelectronic semiconductor component described here.

The exemplary embodiment of FIG. 2 shows that eight of the emitter pillars 5 are assigned to one of the contact pillars 4. Different groups can be formed, for example groups 55R for generating red light, groups 55G for generating green light, and groups 55B for generating blue light. Accordingly, color-emitting groups 55R, 55G, 55B can be grouped into a pixel 6.

Red, green and blue light is produced either directly by the semiconductor pillars 3 themselves or, specifically for red and green light, by a fluorescent material, not shown in FIG. 2, which may be contained in the carrier 77, for example, and/or which is applied to the current distribution layers 44. A corresponding fluorescent or fluorescent materials may be present in the same way in all exemplary embodiments.

Unlike in the illustration in FIG. 2, it is possible that no subdivision is made into dedicated groups, so that a two-dimensional light source without internal subdivision is provided. In this case, for example, a two-dimensionally applied, continuous fluorescent material is present, for producing white light together with blue light, for example.

Figure 3A:
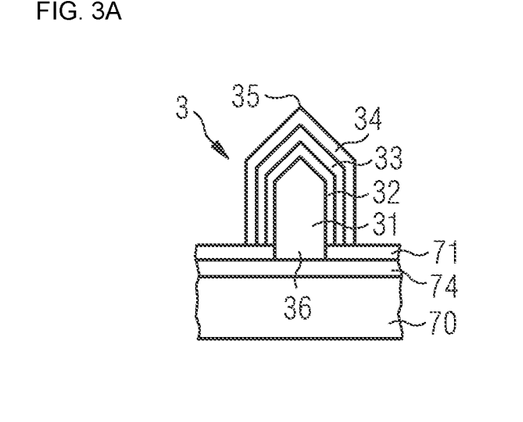
FIGS. 3A and 3B show schematic sectional views of semiconductor pillars for exemplary embodiments of optoelectronic semiconductor components.

FIG. 3A shows that in addition to the semiconductor core 31, the active zone 32 and the semiconductor shell 33, the semiconductor pillars 3 can also have an energization layer 34, for example made of a metal or a transparent conductive oxide. Only the semiconductor cores 31 are in contact with the growth layer 74. In addition, isolation is provided by the mask layer 71. The semiconductor pillars 3 have a marked peak 35.

Figure 3B:
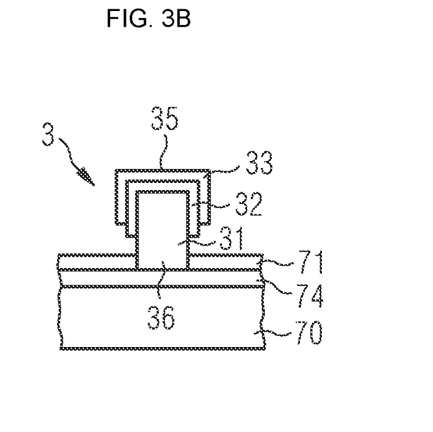

On the other hand, the semiconductor pillars 3 of FIG. 3B are flat at the tip 35. It is possible that the layers 32, 33 do not extend as far as the mask layer 71.

Such semiconductor pillars 3 can be used in all exemplary embodiments.

Figure 4:
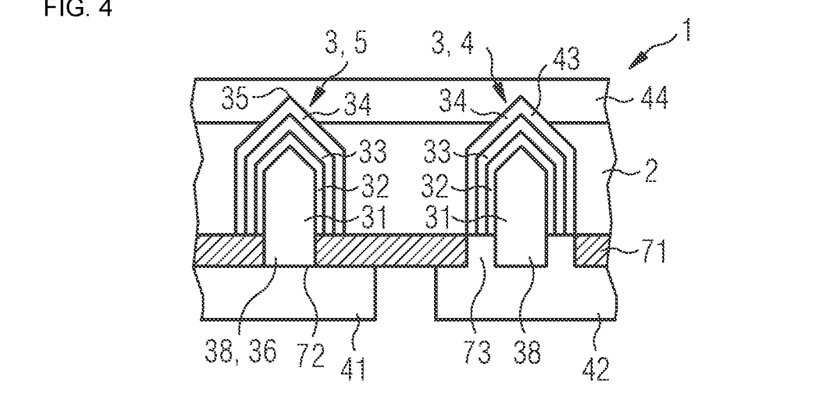
FIG. 4 shows a schematic sectional view of an exemplary embodiment of an optoelectronic semiconductor component described here.

FIG. 4 illustrates that all semiconductor pillars 3 are identically designed in respect of the components 31, 32, 33, 34. Due to the energization layer 34, it is possible that the energization layer 34 is identical to the outer layer 43 of the contact pillars 4. This provides an electrical cross-connection via the current distribution layer 44, which electrically connects the relevant energization layers 34 of the associated contact pillars 4 and emitter pillars 5 together.

It is also illustrated that in the case of the contact pillars 4, the components 31, 32, 33, 34 are directly connected to the second contact pad 42 due to the extension opening 73.

Figure 5:
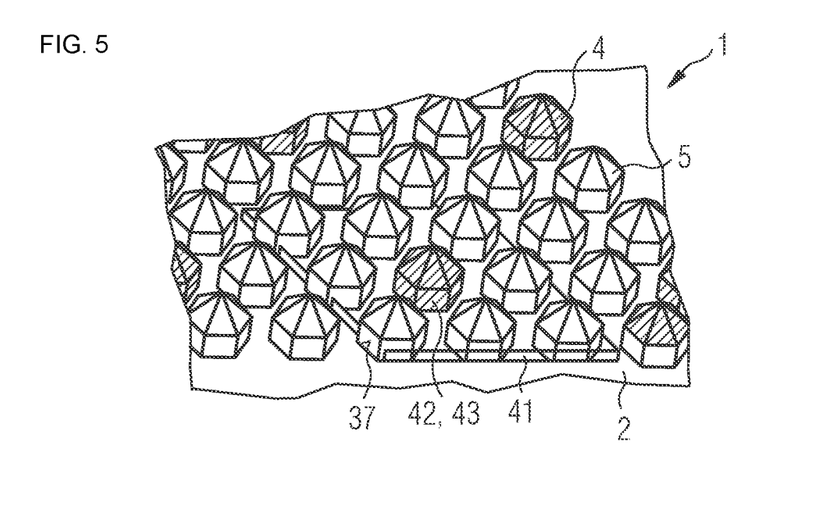
FIG. 5 shows a perspective plan view of an exemplary embodiment of an optoelectronic semiconductor component described here.

FIG. 5 illustrates that the contact pads 41, 42 do not necessarily completely cover and/or extend beyond the semiconductor pillars 3. Thus, the contact pads 41, 42 according to FIG. 5 are primarily located on the side faces 37, so that the semiconductor pillars 3 can extend beyond the two-dimensional contact pads 41, 42.

FIG. 6 illustrates another production method for the semiconductor components 1. The method step of FIG. 6A is based in particular on the step of FIG. 1F.

Figure 6A:
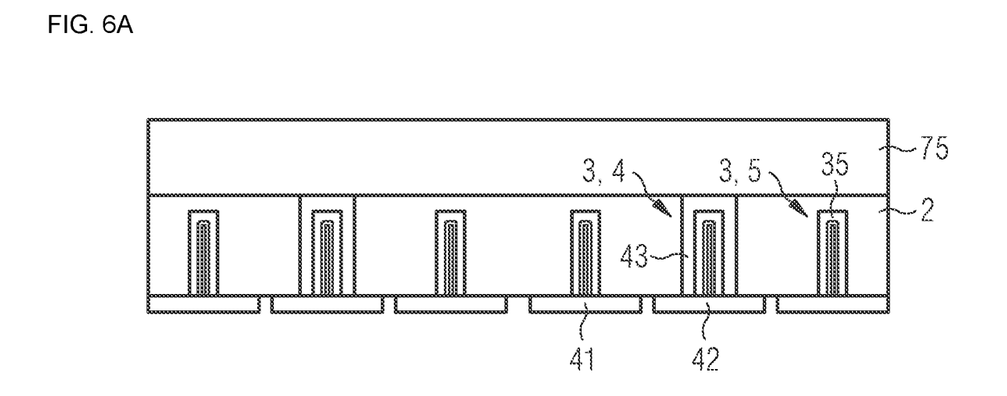
FIGS. 6A and 6C show schematic sectional drawings of method steps of a method described here for producing exemplary embodiments of optoelectronic semiconductor components.

Both the first and second contact pads 41, 42 are produced on the side of the isolation layer 2 facing away from the intermediate carrier 75. The mask layer, not drawn, is preferably designed in accordance with FIG. 1.

Figure 6B:
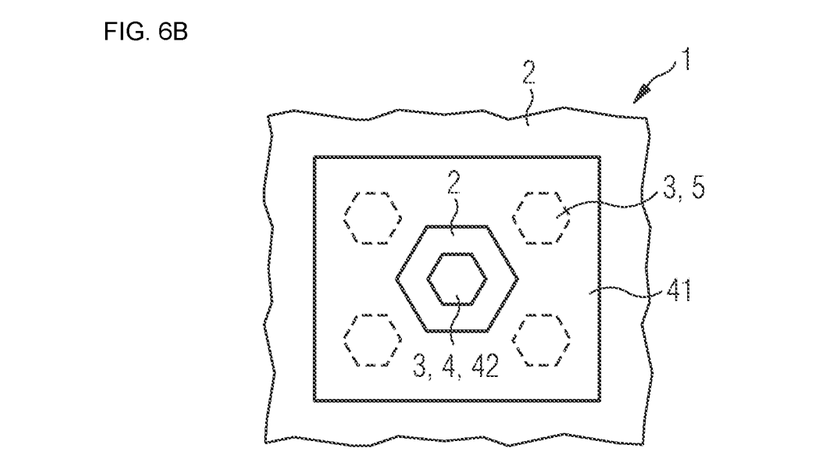
FIGS. 6B and 6D show schematic bottom views and schematic plan views of exemplary embodiments of optoelectronic semiconductor components described here.

FIG. 6B shows that the second contact pad 42, seen in plan view, is enclosed by the first contact pad 41, separated by an annular-shaped area of the isolation layer 2. Otherwise, FIG. 6B is identical to FIG. 1K.

Figure 6C:
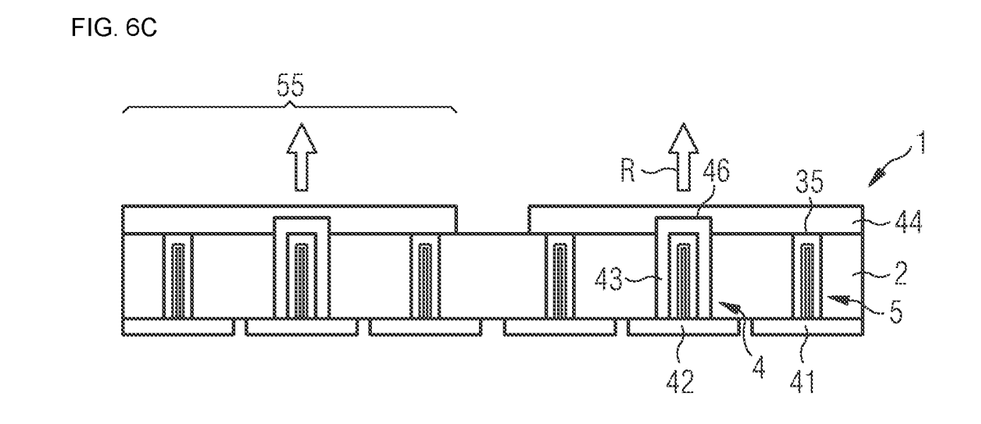

According to FIG. 6C, after the intermediate carrier 75 has been removed the current distribution layer 44, which is radiation-permeable, is produced. The contact tips 46 of the outer layer 43 preferably each protrude into the current distribution layer 44. All semiconductor pillars 3 can have the same height.

Figure 6D:
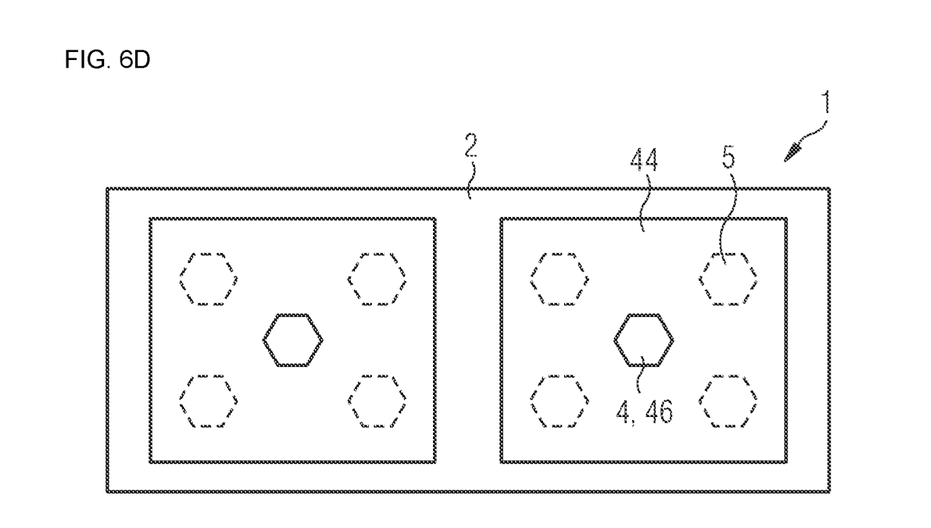

FIG. 6D illustrates a plan view corresponding to FIG. 6C.

Figure 7:
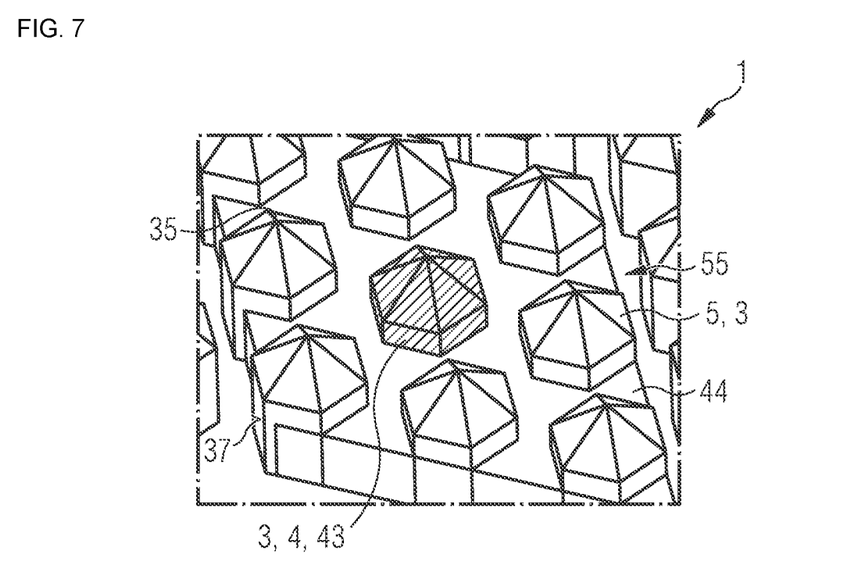
FIG. 7 shows a perspective plan view of an exemplary embodiment of an optoelectronic semiconductor component described here.

As shown in FIG. 7, it is possible that the current distribution layer 44 can be confined to the side surfaces 37 of the semiconductor pillars. This allows the semiconductor pillars 3 to extend beyond the current distribution layer 44, unlike the case shown in FIG. 6. In addition, this allows a radiation characteristic to be set by shaping, for example, the tips 35 of the emitter pillars 5.

Figure 8:
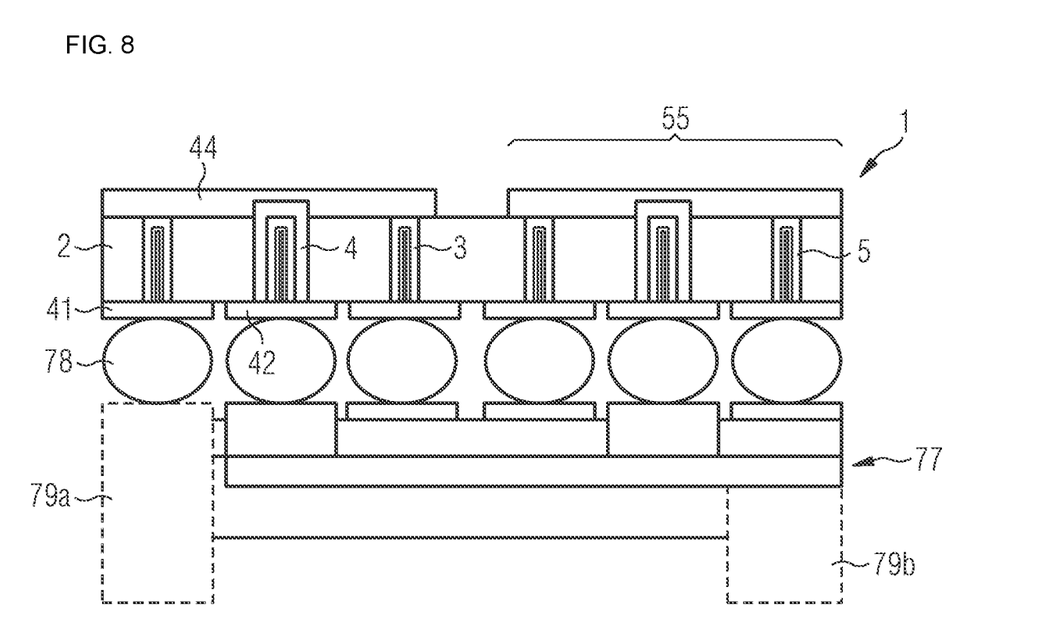
FIG. 8 shows a schematic sectional view of an exemplary embodiment of an optoelectronic semiconductor component described here, mounted on a carrier.

FIG. 8 shows that the semiconductor component 1 of FIG. 6C, for example, is mounted on an external carrier 77. An electrical connection is made via electrical connecting means 78, for example solder balls. Electrical conductor tracks 79a, 79b can be used to implement electrical activation of the contact pillars 4 and the emitter pillars 5. The emitter pillars 5 can be combined into groups 55, which can preferably be electrically activated independently of each other.

As an alternative to solder balls, planar layers such as electroplated layers, or cylindrical structures such as so-called pillars, can also be used for the connecting means 78.

A suitable interconnection in the carrier 77 enables a display with a high resolution, in particular pixel-precise, to be implemented. For example, the carrier 77 is then an IC, a microcontroller or an application-specific IC. Each first and/or second electrical contact pad 41, 42 can therefore be assigned its own switching element in the carrier 77 for targeted and mutually independent energization.

The arrangement with the semiconductor pillars 3 can also be applied electrically, in particular soldered, in a planar manner on a re-wiring carrier as an extremely thin layer, only electrically connected by the annular contacts or contact pillars 4. The light-active layer then consists of the thin single pixels on the re-wiring carrier.

The components shown in the figures, unless otherwise indicated, preferably follow one another directly in the specified sequence. Layers that do not touch each other in the figures are preferably spaced apart from each other. Where lines are drawn parallel to each other, the corresponding surfaces are preferably also oriented parallel to each other. Also, unless otherwise indicated, the relative positions of the drawn components with respect to one another are reproduced correctly in the figures.

The invention described here is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. An optoelectronic semiconductor component comprising:
a plurality of semiconductor pillars, each pillar having a tip and a base region at opposite ends, wherein the semiconductor pillars comprise emitter pillars configured to generate radiation and non-radiating electrical contact pillars;
an electrical isolation layer surrounding at least part of the semiconductor pillars on side faces;
at least one first electrical contact pad and at least one second electrical contact pad for energizing the semiconductor pillars; and
at least one current distribution layer located on a side of the electrical isolation layer opposite the first and second contact pads, the current distribution layer configured to provide an electrical connection between at least one of the contact pillars and at least one of the emitter pillars,
wherein the semiconductor pillars extend through the electrical isolation layer such that the first and second contact pads are located on the same side of the electrical isolation layer,
wherein the tip of each of the contact pillars is coated with an electrically ohmically conductive outer layer,
wherein, for each current distribution layer, the electrically ohmically conductive outer layer is arranged between the current distribution layer and the tip of the at least one of the contact pillars so that the current distribution layer is in direct contact with the electrically ohmically conductive outer layer and the tip of the at least one of the emitter pillars facing the current distribution layer, and
wherein the electrical isolation layer is arranged laterally between the side faces of the emitter pillars and side faces of the electrically ohmically conductive outer layer coated on the contact pillars.

2. The optoelectronic semiconductor component according to claim 1, wherein the at least one of the emitter pillars are arranged rotationally symmetrically around the at least one of the contact pillars, when viewed from above.

3. The optoelectronic semiconductor component according to claim 1,
wherein the electrically ohmically conductive outer layer comprises a metallic layer impermeable to the radiation.

4. The optoelectronic semiconductor component according to claim 3, wherein the current distribution layer is permeable to the radiation, and wherein a thickness of the current distribution layer is between 10 nm and 0.4 μm inclusive.

5. The optoelectronic semiconductor component according to claim 1, wherein the radiation of the emitter pillars is configured to exit the optoelectronic semiconductor component through the current distribution layer.

6. The optoelectronic semiconductor component according to claim 1,
wherein the emitter pillars and the contact pillars are identical except for the electrically ohmically conductive outer layer.

7. The optoelectronic semiconductor component according to claim 1, wherein the electrically ohmically conductive outer layer protrude into the current distribution layer.

8. The optoelectronic semiconductor component according to claim 1, wherein the electrical isolation layer is a cured silicone.

9. The optoelectronic semiconductor component according to claim 1, wherein the electrical isolation layer is a cured thermoplastic.

10. The optoelectronic semiconductor component according to claim 1, wherein the optoelectronic semiconductor component accommodates up to 30 contact pillars per $\mu m^2$.

11. The optoelectronic semiconductor component according to claim 1, wherein a height of the current distribution layer is not more than 20% of a mean height of the semiconductor pillars.

* * * * *